United States Patent [19]

Smith et al.

[11] Patent Number: 4,570,324
[45] Date of Patent: Feb. 18, 1986

[54] STABLE OHMIC CONTACTS FOR GALLIUM ARSENIDE SEMICONDUCTORS

[75] Inventors: Steven R. Smith, Dayton; James S. Solomon, Springfield, both of Ohio

[73] Assignee: The University of Dayton, Dayton, Ohio

[21] Appl. No.: 661,981

[22] Filed: Oct. 17, 1984

[51] Int. Cl.$^4$ .................... H01L 21/265; H01L 7/54; H01L 7/36

[52] U.S. Cl. .................................. 29/576 B; 29/578; 148/1.5; 148/175; 148/187; 357/67; 357/91

[58] Field of Search ............... 29/576 B, 578; 148/1.5, 148/175, 187; 357/67, 91

[56] References Cited

U.S. PATENT DOCUMENTS

| | | | |
|---|---|---|---|
| 3,245,848 | 4/1966 | De Vaux et al. | 148/186 |
| 3,532,562 | 10/1970 | Clawson et al. | 148/179 |
| 3,600,797 | 8/1971 | Bower et al. | 29/584 |
| 4,033,788 | 7/1977 | Hunsperger et al. | 148/1.5 |
| 4,188,710 | 2/1980 | Davey et al. | 29/580 |
| 4,265,934 | 5/1981 | Ladd, Jr. | 427/84 |
| 4,298,403 | 11/1981 | Davey et al. | 148/1.5 |
| 4,330,343 | 5/1982 | Christou et al. | 148/1.5 |
| 4,377,030 | 3/1983 | Pettenpaul et al. | 29/576 B |
| 4,398,963 | 8/1983 | Stall et al. | 148/1.5 |
| 4,426,765 | 1/1984 | Shahriary et al. | 29/576 B |
| 4,426,767 | 1/1984 | Swanson et al. | 29/571 |

OTHER PUBLICATIONS

"Electron Microscope Studies of an Aloyed Au/Ni/Au-Ge Ohmic Contact to GaAs," T. S. Kuan, P. E. Batson, T. N. Jackson, H. Rupprecht and E. L. Wilkie, J. Appl. Phys., 54(12), Dec. 1983.
"A Review of the Theory and Technology for Ohmic Contacts to Group III-V Compound Semiconductors," V. L. Ridout, Solid-State Electronics, vol. 18, 1975.
"Metallurgical and Electrical Properties of Alloyed Ni/Au-Ge Films on n-Type GaAs," G. Y. Robinson, Solid State Electronics, vol. 18, 1975.
"Investigation of the Au-Ge-Ni System Used for Alloyed Contacts to GaAs," M. Wittmer, R. Pretorius, J. W. Mayer and M-A. Nicolet, Solid-State Electronics, vol. 20, 1977.
"Ohmic Contacts to GaAs Lasers Using Ion-Beam Technology," Carsten Lindstrom, IEEE Transactions on Electron Devices, vol. ID-30, No. 1, Jan. 1983.
"Ion Mixing," S. Matteson and M-A. Nicolet, Ann. Rev. Mater. Sci., 1983, 13:339-62.
"The Characteristics of Au-Ge-Based Ohmic Contacts to n-GaAs Including the Effects of Aging," Gregory S. Marlow, Mukunda B. Das and Luis Tongson, Solid-State Electronics, vol. 26, No. 4, 1983.
"Au/Ge Based Ohmic Contacts to GaAs," C. R. M. Grovenor, Solid-State Electronics, vol. 24, No. 8, pp. 792-793, 1981.
"Alloying Behavior of Ni/Au-Ge Films on GaAs," Masaki Ogawa, J. Appl. Phys., 51(1), Jan., 1980.
"Metallurgical and Electrical Characterization of Metal-Semiconductor Contacts," G. Y. Robinson, Thin Solid Films, 72 (1980) 129-141.
"Development of Ohmic Contacts for GaAs Devices Using Epitaxial GE Films," Wallace T. Anderson, Jr., IEEE Journal of Solid-State Circuits, vol. SC-13, No. 4, Aug. 1978.
"Characteristics of AuGeNi Ohmic Contacts to GaAs," M. Heiblum, M. I. Nathan and C. A. Chang, Solid-State Electronics, vol. 25, No. 3, pp. 185-195, 1982.
"Ohmic Contacts to III-V Compound Semiconductors: A Review of Fabrication Techniques," A. Piotrowska, A. Guivaroh and G. Pelous, Solid-State Electronics, vol. 236, No. 3, pp. 197-197, 1983.
Barnes et al., Appl. Phys. Letts., 33 (1978) 965.
Heiblum et al., IBM-TDB, 25 (1982) p. 1192.

Primary Examiner—Upendra Roy
Attorney, Agent, or Firm—Biebel, French & Nauman

[57] ABSTRACT

Ohmic contacts are formed on an n-type gallium arsenide semiconductor by applying a layer of nickel to a contact surface of the semiconductor, bombarding the nickel layer with a beam of germanium ions to drive nickel and germanium atoms into the contact area of the semiconductor, annealing the semiconductor by means of lamp annealing techniques, and then forming a layer of gold to at least a portion of the irradiated nickel layer to facilitate connection of an electrical conductor thereto. Tellerium may be used in place of germanium for n-type semiconductors. For p-type gallium arsenide semiconductors, ohmic contacts may be formed by bombarding a nickel layer with either zinc or copper ions.

10 Claims, 5 Drawing Figures

STABLE OHMIC CONTACTS FOR GALLIUM ARSENIDE SEMICONDUCTORS

BACKGROUND OF THE INVENTION

This invention relates generally to semiconductor devices and, more particularly, to stable ohmic contacts for a gallium arsenide semiconductor and a method for producing such contacts.

In the art of manufacturing semiconductor devices, contacts must be connected to or incorporated within the body of a semiconductor such that electrical connections can be made thereto. Preferably, a contact is made such that no rectifying barrier or junction is formed between the contact and the body of the semiconductor. Such a non-rectifying contact is referred to as an ohmic contact.

Ohmic contacts may be formed on the semiconductor by thermally alloying appropriate metals to and with the semiconductor at a selected contact area on the surface of the semiconductor. The alloy process is very sensitive to time duration and temperature, and the temperatures required are often so high that undesired contaminants are introduced into the contact, the semiconductor or both. This is a particular problem in field effect transistors (FET's) wherein an electrical contact must be made on an insulating gate of the semiconductor.

A method of forming ohmic contacts on semiconductors utilizing ion implantation is disclosed in U.S. Pat. No. 3,600,797. Ion implantation is a process which has been used for some time to implant impurity atoms in a semiconductor. The impurity atoms which are normally neutrally charged are ionized by inducing a predetermined electrical charge thereon. The ions are formed into an ion beam by electrical fields such that the size, shape and velocity of the ion beam can be controlled.

The ions are then made to enter the lattice framework of a semiconductor by directing the beam at the semiconductor, with the result that atoms of the impurity are positioned within the lattice of the semiconductor at desired positions. By controlling the direction and velocity of the ions in the beam, impurity atoms may be placed in a well defined region of the semiconductor.

Ion implantation may be direct where the ionized impurities are injected into the semiconductor or indirect where a layer of impurity material is initially applied to the semiconductor and then bombarded with ions of another material. For indirect implantation, the ions are electrically inert, i.e., a material which does not establish any particular type of conductivity in the semiconductor and which does not otherwise adversely effect the electrical or physical properties of the semiconductor. The momentum of the electrically inert ions serves to drive or deflect atoms of the impurity layer into the semiconductor. Direct and indirect ion implantation can be combined if electrically active ions are directed at an impurity layer of material on a semiconductor with the impurities from the layer and the ionized atoms both being injected into the semiconductor.

In the semiconductor contact forming method utilizing ion implantation as disclosed in U.S. Pat. No. 3,600,797, a layer of gold is initially deposited on a selected contact area of the semiconductor and the gold layer is irradiated with ions of an electrically inert material. Alternately, ions of an electrically active material, such as tellerium for n-type material, can be used to bombard the gold layer. In either event, gold atoms and atoms of the ionized bombarding beam are driven into the semiconductor to establish an ohmic contact for the semiconductor.

The literature teaches that gold based ohmic contacts to gallium arsenide tend to deteriorate upon aging due to the migration or spreading of the gold. See, for example, *Electron Microscope Studies of an Alloyed Au/Ni/Au-Ge Ohmic Contact to GaAs* by T.S. Kuan et al., J. Appl. Phys. 54 (12), December, 1983. Such deterioration of gold based ohmic contacts is amplified and accelerated when contacts are subjected to elevated temperatures or strong electrical fields. Accordingly, an ohmic contact which is initially formed by depositing gold on a GaAs semiconductor, even if atoms of the gold are implanted or mixed into the semiconducter, can be expected to result in a contact which has a rectifying barrier as the contact ages. It is thus apparent that the need exists for a stable ohmic contact for gallium arsenide semiconductors and a method for making such a contact.

SUMMARY OF THE INVENTION

In accordance with the present invention, gold is not utilized in the contact formation process, but is applied as a thin layer to the contact after formation to facilitate connection of an electrical conductor to the contact. The method of making an ohmic contact to a gallium arsenide semiconductor in accordance with the present invention comprises applying a layer of nickel to a selected contact area of a surface of the semiconductor. At least a portion of the nickel layer is then irradiated with ions of an electrically active material such that atoms of nickel and atoms of the electrically active material are driven into the semiconductor to form an ohmic contact thereto. Since the semiconductor lattice is disrupted by the ion bombardment, the semiconductor is annealed to repair the semiconductor lattice by epitaxial regrowth. Finally, a layer of gold is applied to at least a portion of the irradiated portion of the nickel layer to facilitate the connection of an electrical conductor thereto. Gold is thus only applied to the nickel layer after the contact formation process. The nickel layer forms a boundary between the gold and the semiconductor to prevent diffusion of the gold to the surface of the semiconductor where it would result in the formation of a rectifying barrier to destroy the ohmic nature of the contact. To ensure the integrity of the nickel boundary layer, a second layer of nickel may be applied to the contact area after the semiconductor is annealed.

For n-type gallium arsenide semiconductors, the electrically active material forming the ion beam irradiating the nickel layer preferably comprises germanium although tellerium may also be utilized. For p-type gallium arsenide, the electrically active material preferably comprises zinc although copper may also be utilized. The annealing step preferably comprises transient annealing in a vacuum by means of an incoherent light source, i.e., lamp annealing, for a period of 15 to 20 seconds. A coherent light source such as a laser beam could also be used; however, such use would unnecessarily complicate the formation of contacts in accordance with the present invention.

It is, therefore, an object of the present invention to provide a stable ohmic contact for gallium arsenide semiconductors by depositing a layer of nickel on the semiconductor, irradiating the nickel with germanium ions to form a contact, annealing the semiconductor to repair irradiation damage and depositing a layer of gold on the nickel contact area to facilitate connection of an electrical conductor to the semiconductor.

Other objects and advantages of the invention will be apparent from the following description, the accompanying drawings and the appended claims.

DETAILED DESCRIPTION OF THE INVENTION

Figure 1:
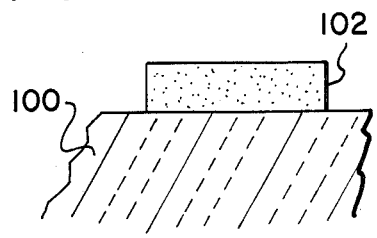
FIGS. 1-5 illustrate the steps required to form stable ohmic contacts to gallium arsenide semiconductors in accordance with the present invention.

FIG. 1 shows a sectioned portion of a gallium arsenide semiconductor 100 to which an electrical contact is to be formed. A nickel layer 102 is applied to a selected contact area of the surface of the semiconductor 100 by any of the well known techniques in the art of semiconductor production. Individual nickel atoms are represented schematically by the dots within the nickel layer 102. At least a portion of the nickel layer 102 is irradiated by an ion beam 104 which is produced by an ion beam generator 106. A variety of such ion beam generators are commercially available with a suitable ion beam generator identified as a 400-10AR being available from The Varian Company.

The ion beam 104 comprises ions of an electrically active material which preferably comprises germanium for n-type gallium arsenide semiconductors. The potential of the beam 104 depends upon the depth of the nickel layer 102 and the desired depth of penetration for the electrical contact into the gallium arsenide semiconductor 100. Particular beam potentials for varying thicknesses of the nickel layer 102 and depths of penetration will not be described herein since they are apparent to those skilled in the art of ion beam mixing or implantation.

Figure 2:
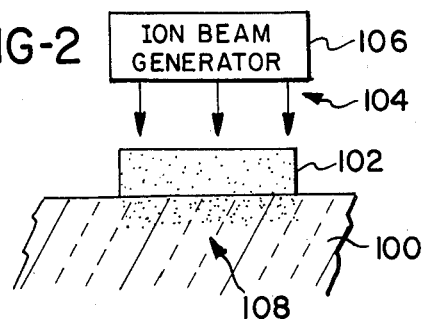
Figure 3:
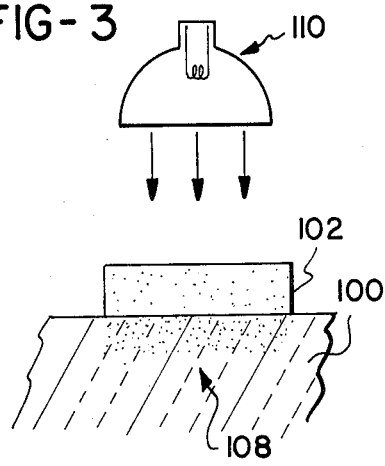
Figure 4:
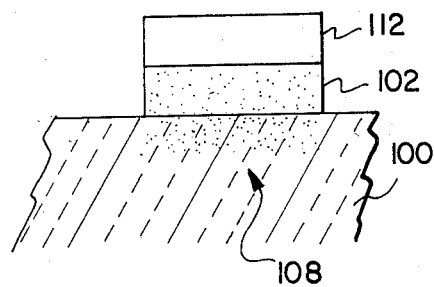

In FIGS. 2-4, the contact area 108 of the gallium arsenide semiconductor 100 located beneath the nickel layer 102 is shown schematically as being penetrated by nickel atoms as well as germanium atoms due to the bombardment by the ion beam 104. The bombardment by the ion beam 104 through the nickel layer 102 into the semiconductor 100 results in a disruption of the lattice of the semiconductor. Accordingly, the semiconductor 100 and particularly the contact area 108 beneath the nickel layer 102 is annealed to restore the semiconductor lattice structure by epitaxial regrowth.

The annealing is preferably transient and performed by a high intensity incoherent light source or lamp 110 as shown in FIG. 3 which is directed upon the semiconductor or contact area for a period of 15 to 20 seconds. For example, a high intensity projection lamp, such as a Sylvania DYV lamp, may be used to achieve an appropriate annealing temperature for the designated annealing time period. Alternately, the annealing may be performed by a pulsed incoherent light source or "flash lamp" as will be apparent to those skilled in the art. A suitable flash lamp for performing the annealing process is available from AG Associates and identified as a Heatpulse 210T-02.

The annealing process results in a ternary alloy of germanium, arsenic and nickel which actually forms the contact region 108 within the semiconductor 100 beneath the irradiated portion of the nickel layer 102. While this is the preferred method and structure for the contact in accordance with the present invention, tellerium may also be utilized in place of germanium in the ion beam generator 106.

Figure 5:
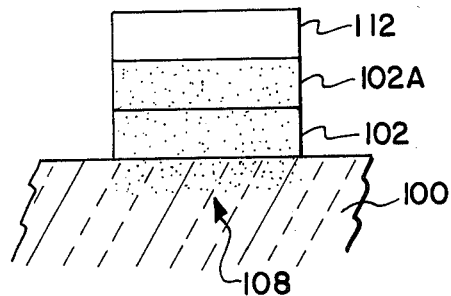

Once the contact area 108 has been thus formed, a layer of gold 112 is deposited onto the nickel layer 102 to facilitate connection of an electrical conductor to the semiconductor contact. It is apparent from a review of FIG. 4 that the nickel layer 102 is retained after formation of the contact area 108 and forms a boundary layer between the gold layer 112 and the semiconductor 100 to prevent the diffusion of the gold 112 to the surface of the semiconductor 100. The nickel layer 102 or boundary layer thus prevents the formation of a rectifying barrier which would otherwise be formed and destroy the ohmic nature of the contact formed in accordance with the present invention. To ensure the integrity of the nickel boundary layer, a second layer of nickel 102A may be applied to the nickel layer 102 after the semiconductor is annealed and before the layer of gold 112 is applied as shown in FIG. 5.

While the process and product herein described constitute preferred embodiments of the invention, it is to be understood that the invention is not limited to this precise process and product, and that changes may be made therein without departing from the scope of the invention which is defined in the appended claims.

What is claimed is:

1. A method of making an ohmic contact to a gallium arsenide semiconductor comprising the following steps:

applying a layer of nickel to a selected contact area of a surface of said semiconductor;

irradiating at least a portion of said nickel layer with ions of an electrically active material whereby atoms of nickel and atoms of said electrically active material are driven into said semiconductor to form an ohmic contact to said semiconductor;

transient annealing said semiconductor; and applying a layer of gold to at least a portion of the irradiated portion of said nickel layer to facilitate connection of an electrical conductor thereto whereby said nickel layer forms a boundary between said gold layer and said semiconductor to prevent the diffusion of said gold to the surface of said semiconductor and the resultant formation of a rectifying barrier which would destroy the ohmic nature of said contact.

2. The method as claimed in claim 1 further comprising the step of applying an additional layer of nickel to said selected contact area after annealing said semiconductor.

3. The method as claimed in claim 2 wherein said semiconductor is n-type and said electrically active material comprises germanium.

4. The method as claimed in claim 2 wherein said semiconductor is n-type and said electrically active material comprises tellerium.

5. The method as claimed in claim 2 wherein said semiconductor is p-type and said electrically active material comprises zinc.

6. The method as claimed in claim 2 wherein said semiconductor is p-type and said electrically active material comprises copper.

7. The method as claimed in claim 3 wherein the step of transient annealing comprises annealing for a period of 15 to 20 seconds 8. The method as claimed in claim 4 wherein the step of transient annealing comprises annealing for a period of 15 to 20 seconds.

9. The method as claimed in claim 5 wherein the step of transient annealing comprises annealing for a period of 15 to 20 seconds.

10. The method as claimed in claim 6 wherein the step of transient annealing comprises annealing for a period of 15 to 20 seconds.

* * * * *